United States Patent
Schwab et al.

[11] Patent Number: 5,903,177
[45] Date of Patent: *May 11, 1999

[54] COMPENSATION NETWORK FOR PINCH OFF VOLTAGE SENSITIVE CIRCUITS

[75] Inventors: Paul John Schwab, Hudson, N.H.; Wayne Mack Struble, Franklin, Mass.

[73] Assignee: The Whitaker Corporation, Wilmington, Del.

[ * ] Notice: This patent issued on a continued prosecution application filed under 37 CFR 1.53(d), and is subject to the twenty year patent term provisions of 35 U.S.C. 154(a)(2).

[21] Appl. No.: 08/706,585

[22] Filed: Sep. 5, 1996

[51] Int. Cl.$^6$ .................................................. G05F 3/20
[52] U.S. Cl. ........................ 327/308; 327/103; 327/538; 333/81 R
[58] Field of Search ....................... 327/101, 103, 327/308, 309, 77–80, 143, 530, 538, 539, 540, 541, 543, 545, 546, 548, 493, 404, 405, 419, 427, 430, 431, 434–437; 333/81 R

[56] References Cited

U.S. PATENT DOCUMENTS

| | | | |
|---|---|---|---|
| 4,020,367 | 4/1977 | Yamashiro et al. | 327/538 |
| 4,260,946 | 4/1981 | Wheatley, Jr. | 323/314 |
| 4,686,451 | 8/1987 | Li et al. | 323/313 |
| 4,760,284 | 7/1988 | Taylor | 327/541 |
| 4,788,455 | 11/1988 | Mori et al. | 327/538 |
| 4,825,145 | 4/1989 | Tanaka et al. | 323/315 |
| 4,857,769 | 8/1989 | Kotera et al. | 327/541 |
| 5,157,323 | 10/1992 | Ali et al. | 333/81 R |
| 5,440,280 | 8/1995 | Lord | 327/308 |
| 5,488,328 | 1/1996 | Ludwig et al. | 327/541 |

FOREIGN PATENT DOCUMENTS

| | | | |
|---|---|---|---|
| 5-13686 | 3/1991 | Japan | H01L 27/07 |
| 3-238910 | 10/1991 | Japan | H03H 11/24 |

OTHER PUBLICATIONS

Sedra et al., "Microelectronic Circuits" published by Saunders College Publishing, 1989, pp. 317, 362–363.

Engineering Release; ICPD Control Devices Engineering, Micro–Electronics Division, M/A–COM; GaAs MMIC Digital and Analog Attenuators.

*IEEE 1996 Microwave and Millimeter-Wave Monolithic Circuits Symposium*; "A Technique for Improving the Distortion of GaAs Variable Attenuator IC Using Squeezed–Gate FET Structure"; Miyatsuji et al.

International Search Report/PCT/US97/15494/Dec. 11, 1997.

*Primary Examiner*—Tuan T. Lam

[57] ABSTRACT

A control circuit is provided that can be used to compensate for pinch off voltage sensitive circuits. The control circuit comprises a control FET (26) having a gate (27), a drain (29), and a source (28). The control FET source (28) is connected to a tracking potential (23) through control FET source resistor (31) in series with a constant voltage drop element (32). A control voltage input (22) is applied to the control FET drain (29). A current flow through the control FET (26) results in a transfer function that is substantially linear for linear changes in control voltage input below a voltage pinch off value of the control FET (26). As the voltage control output (23) approaches the pinch off voltage value of the control FET (26), smaller changes in control voltage output (23) are realized for the same change in control voltage input (22).

29 Claims, 10 Drawing Sheets

COMPENSATION NETWORK FOR PINCH OFF VOLTAGE SENSITIVE CIRCUITS

FIELD OF THE INVENTION

The present invention relates to a current or voltage source appropriate for controlling circuits that are sensitive to variations in pinch-off voltage.

BACKGROUND OF THE INVENTION

Figure 1:
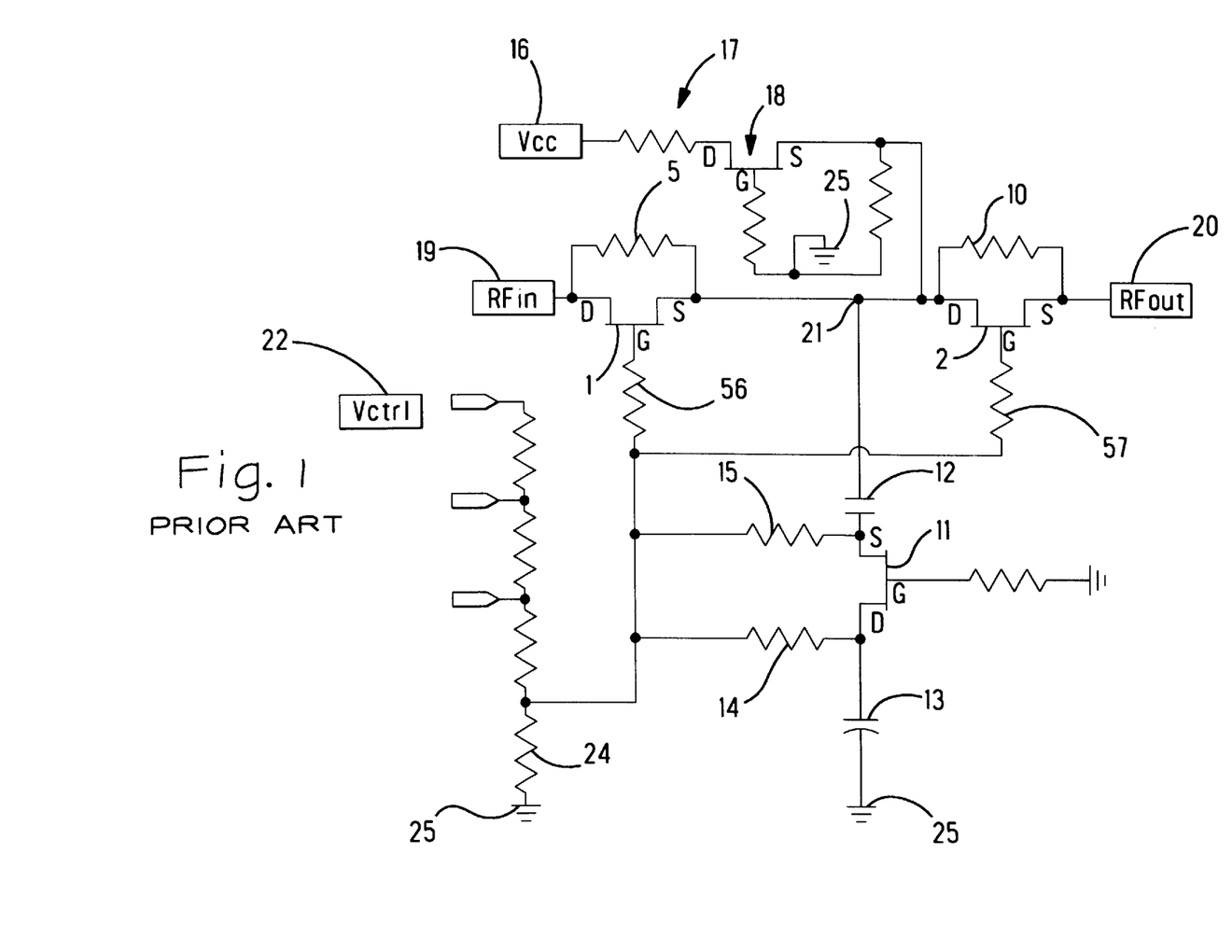
FIG. 1 is a schematic representation of a known linear voltage variable attenuator.

A known passive voltage variable attenuator design, referred to as a "T Structure" attenuator, comprises two series Field Effect Transistors ("FETs") and a shunt FET connected between a point common to the series FETs and reference potential as shown in FIG. 1 of the drawings. An RFin port is an input for RF energy to be attenuated. The attenuated output appears at an RFout port. The RFin port and RFout port are opposite ends of the series FET circuit. The series FETs and the shunt FET are controlled by an attenuation control voltage source. The point common to the series FETs is held substantially at the FETs pinch off voltage. The attenuation control voltage varies the gate voltage of the series FETs. The attenuation control voltage varying the gate voltage of the series FETs controls the gate to source voltage differential causing them to operate as variable resistors over a desired attenuation range. The attenuation control voltage concurrently varies the drain voltage and source voltage of the shunt FET, while the gate of the shunt FET is connected to reference potential. Therefore, the varying attenuation control voltage also causes the shunt FET to operate as a variable resistor over the same range, but in opposite relationship with respect to the attenuation control voltage value as the series FETs. The circuit is particularly well adapted for use in a radio frequency voltage variable attenuator using GaAs MESFETs.

In the T structure voltage variable attenuator circuit, attenuation is lowest at a five volt control voltage value and highest at a zero volt control voltage value. A control voltage input biases a resistive divider network. A control voltage output of the resistive divider network is the attenuation control voltage and varies from zero to approximately pinch off voltage of the FETs as the control voltage input ramps from zero to a maximum voltage, typically five volts. A point common to the series FETs is held at the pinch off voltage by a voltage regulator circuit biased by a fixed voltage source typically five volts.

In operation a zero volt control voltage input is applied to the resistive divider network resulting in a zero volt attenuation control voltage value. The attenuation control voltage is applied to the gates of the series FETs resulting in a gate to source voltage to both series FETs at approximately a pinch off voltage value. With the gate to source voltage of the series FETs held at approximately pinch off voltage, the series FETs are essentially turned off and are in a high resistance state. The zero volt control voltage input and, therefore, the attenuation control voltage output of the resistive divider network is concurrently applied to the drain and source of the shunt FET while the gate of the shunt FET is held at reference potential. This results in a zero or very small gate to source voltage differential on the shunt FET, thereby turning it on and producing an effective low resistance in the shunt FET. The low resistance in the shunt FET creates a low resistance path to ground. RF energy applied to the RFin port is effectively shorted to ground through the low resistance shunt FET permitting very little RF energy to appear at the RFout port of the voltage variable attenuator.

At a maximum control voltage input level, typically five volts, the voltage variable attenuator is in its lowest attenuation state. A five volt control voltage input ideally produces an attenuation control voltage at or near pinch off which is applied to the gate of the series FETs. The drain and source of the series FETs held at pinch off voltage causes the gate to source voltage differential of the series FETs to be approximately zero. A zero voltage differential between the gate and source of the series FETs turns them on and places them in an effective low resistance state. Concurrently, the five volt control voltage input results in an attenuation control voltage near pinch off to the drain and source of the shunt FET. The gate of the shunt FET is held at reference potential causing the gate to source voltage differential of the shunt FET to be approximately the pinch off voltage value. The pinch off voltage differential between the gate and source of the shunt FET, turns it off and places it in an effective high resistance state. In this state, most of the RF energy applied to the RF input port of the attenuator flows through the two series FETS and appears at the RF output port because the shunt FET is an effective open circuit.

As can be appreciated by one of ordinary skill in the art, proper operation of the voltage variable attenuator requires that the attenuation control voltage ramp from zero volts to approximately pinch off voltage. It is common, however, that FETs made by the same process exhibit some variations in performance characteristics and in particular pinch off voltage. In circuits that are sensitive to pinch off voltage variations for example the attenuator, shown in FIG. 1 of the drawings variations in pinch off voltage vary the transfer function of the circuit and can adversely affect yield and repeatability. In order to compensate for the variations in pinch off voltage and improve yield in the voltage variable attenuator, a resistive divider network having three bond pads therein is included in the circuit as illustrated in FIG. 1. The resistive divider network scales the zero to five volt control voltage input of the attenuator. After determining the pinch off voltage of the FETs in the circuit, electrical connection is made to one of the three bond pads in the resistive divider network. The appropriate bond pad is the one that scales the attenuation voltage control range from the zero to five volt control voltage input range most closely to the zero to the pinch off voltage range that is used internal to the attenuator circuit. Use of the resistive divider network requires measurement of the pinch off voltage, a decision regarding the most desirable bond pad to use in the resistive divider network, and wire bonding to the appropriate bond pad in order to achieve the zero to pinch off voltage scaled control voltage output for attenuation control. This operation is time consuming, costly, and prone to error. It is also coarse and inexact in that only three variations are realizable. There is a need therefore, for an apparatus that can compensate for pinch off voltage variations and is less time consuming and more reliable than prior art solutions. The ability of the manufacturer to produce parts within a narrow performance range over time and temperature is also highly desirable and effects repeatability of the part. It is known that pinch off voltage can vary over time and temperature in some devices. For circuits that are sensitive to pinch off voltage variations, there is also a need for a circuit that will adjust and compensate for variations in pinch off voltage over time and temperature.

SUMMARY OF THE INVENTION

It is an object therefore to provide a circuit that produces a control voltage output range from zero to pinch off voltage as a control voltage input varies from zero to a value above pinch off.

It is a further object to eliminate the need to tune a circuit of a voltage variable attenuator in order to compensate for pinch off voltage variations.

It is a further object to improve the repeatability and yield of circuits sensitive to variations in pinch off voltage.

It is a further object to produce a nonlinear control voltage output in response to a linear control voltage input wherein the voltage rise differential is less as the control voltage output approaches the pinch off voltage value.

It is a further object to improve the switching speed of a voltage variable attenuator.

It is a further object to consume less space for a circuit sensitive to pinch-off voltage variations.

These and other objects are accomplished by a circuit according to the teachings of the present invention in which a current source comprises a control FET having a gate, drain, and source. The gate is held at a tracking potential. A source resistive element and a constant voltage drop element are connected in series with the source. A control voltage input is applied to the drain of the control FET.

A voltage variable attenuator comprises a first and second series FET having a common point interposed therebetween and a shunt FET interposed between the common point and reference potential. An attenuation control comprising a variable voltage source controls the attenuation level. The attenuation control comprises a control FET having a source, gate, and drain. The control FET gate is held at a tracking potential. A source resistive element and a constant voltage drop element is connected in series with the source. A control voltage input is connected to the control FET drain.

It is an advantage of an apparatus according to the teachings of the present invention that a circuit sensitive to variations in pinch off voltage can be compensated without the need for manual tuning through selection of appropriate bonds pads in a resistive divider network. It is a further advantage that an attenuation control voltage results in less of a voltage differential as the attenuation control voltage approaches the pinch off voltage for a linear change in a control voltage input.

DETAILED DESCRIPTION OF THE PREFERRED EMBODIMENTS

Figures 2, 3:
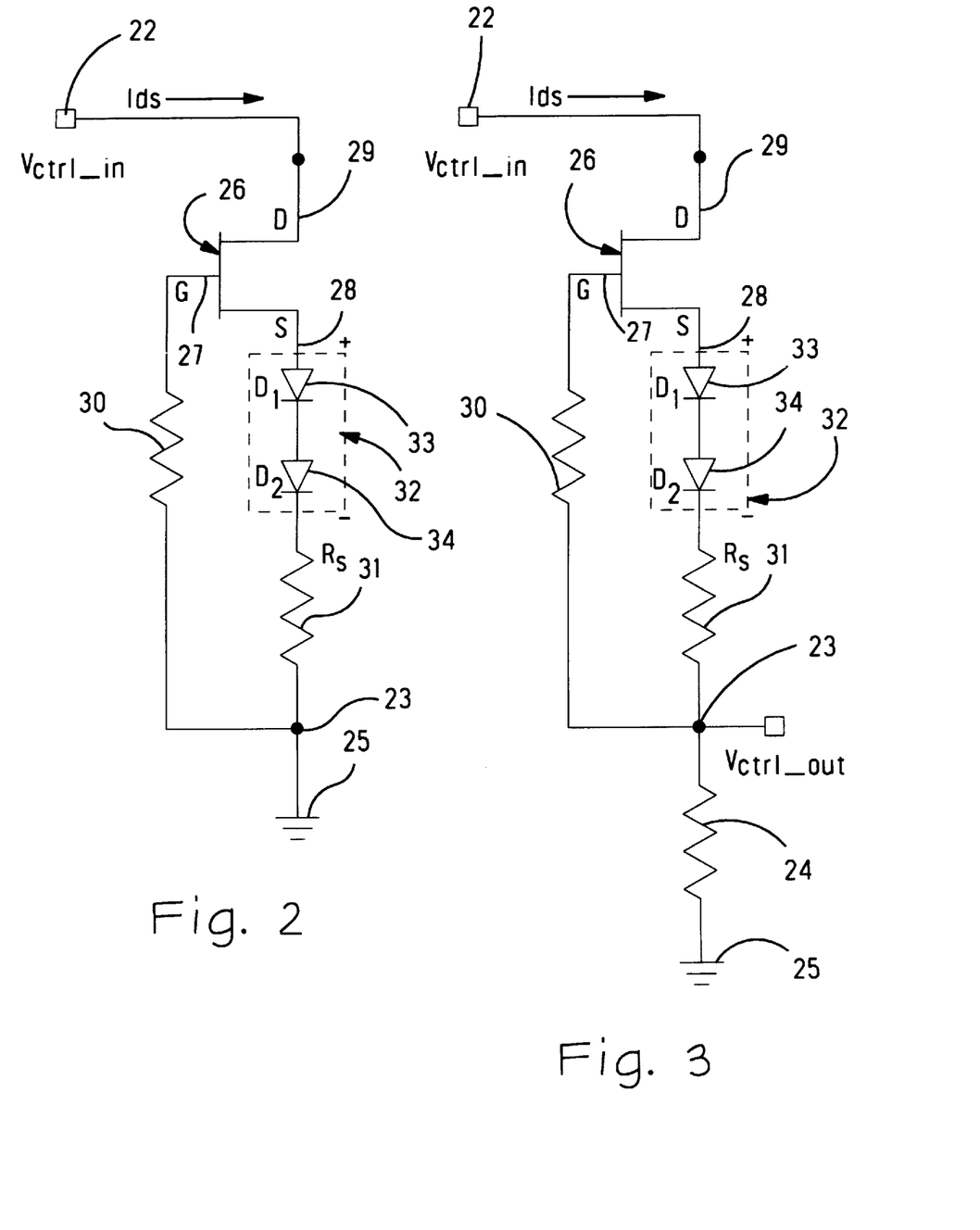
FIG. 2 is a schematic of a current source according to the teachings of the present invention.
FIG. 3 is a schematic of a control voltage circuit according to the teachings of the present invention.

With specific reference to FIG. 2 of the drawings, there is shown a current source according to the teachings of the present invention. The current source comprises a control FET (26) having a gate (27), a source (28), and a drain (29). The gate (27) is held at a tracking potential (23). For a current source as shown in FIG. 2, the tracking potential (23) is ground (25). The gate (27) is preferably connected to the tracking potential (23) through a gate resistor (30) of, for example, 5 kohms. The source (28) is connected to the tracking potential (23) through a constant voltage drop element (32) in series with a source resistive element (31). As one of ordinary skill in the art will appreciate and as shown, the source resistor (31) and constant voltage drop element (32) shown herein as diodes, are in series and can be placed in any order. In a preferred embodiment, the constant voltage drop element (32) is a first diode (33) and second diode (34) in series having a forward path from the source (28) to the tracking potential (23). Alternative forms of the constant voltage drop element (32) include a constant voltage supply, one or more diodes, and a Zener diode. Any voltage drop value may be used and depends upon the desired range of current values generated over the full range of voltage control input. A preferred embodiment of the source resistive element (31) is a 10 kohm resistor.

Figure 4:
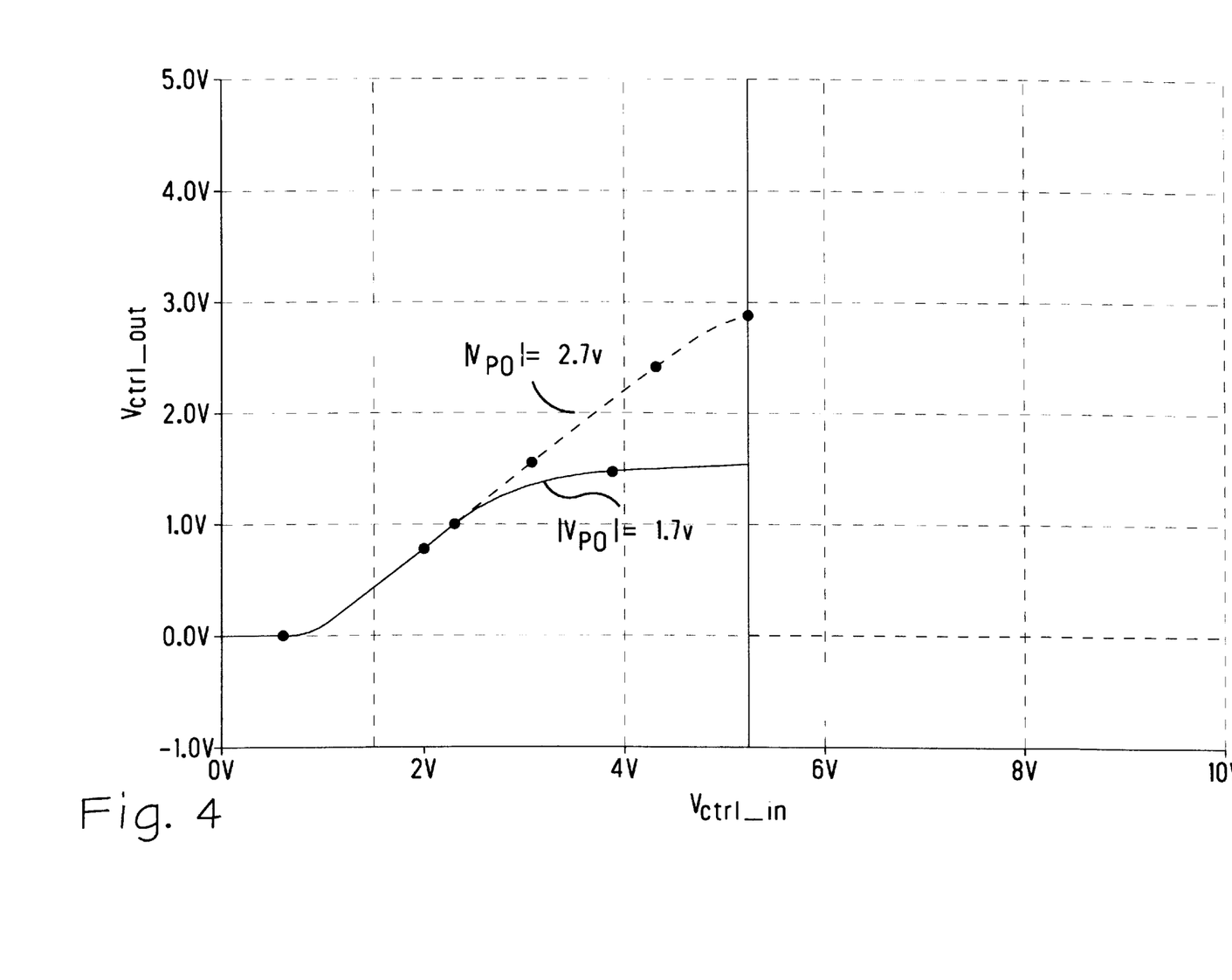
FIG. 4 is a graphical view of a transfer function of the circuit of FIG. 3 for two FETs with different pinch off voltage values.

With specific reference to FIG. 3 of the drawings, there is shown a schematic view of a voltage source according to the teachings of the present invention. The voltage source comprises all the elements of the current source shown in FIG. 2. The resulting current from the current source flows through a control voltage resistor (24). The voltage source further comprises a control voltage impedance element (24) connected between the tracking potential (23) and reference potential or ground (25). The current ($I_{ds}$) from the current source generates a voltage drop across the control voltage impedance element (24) to create the desired transfer function of control voltage output ($V_{CTRL\_OUT}$) (23) relative to control voltage input ($V_{CTRL\_IN}$) (22). The control voltage impedance element (24) can take many forms, a preferred form being a 65 kohm resistor. Alternative embodiments include a resistive divider network to scale the control voltage output (23) to a desired range. FIG. 4 of the drawings shows the transfer function of the circuit of FIG. 3 for two FETs having pinch off voltage magnitudes over a range of typical values.

Figure 5:
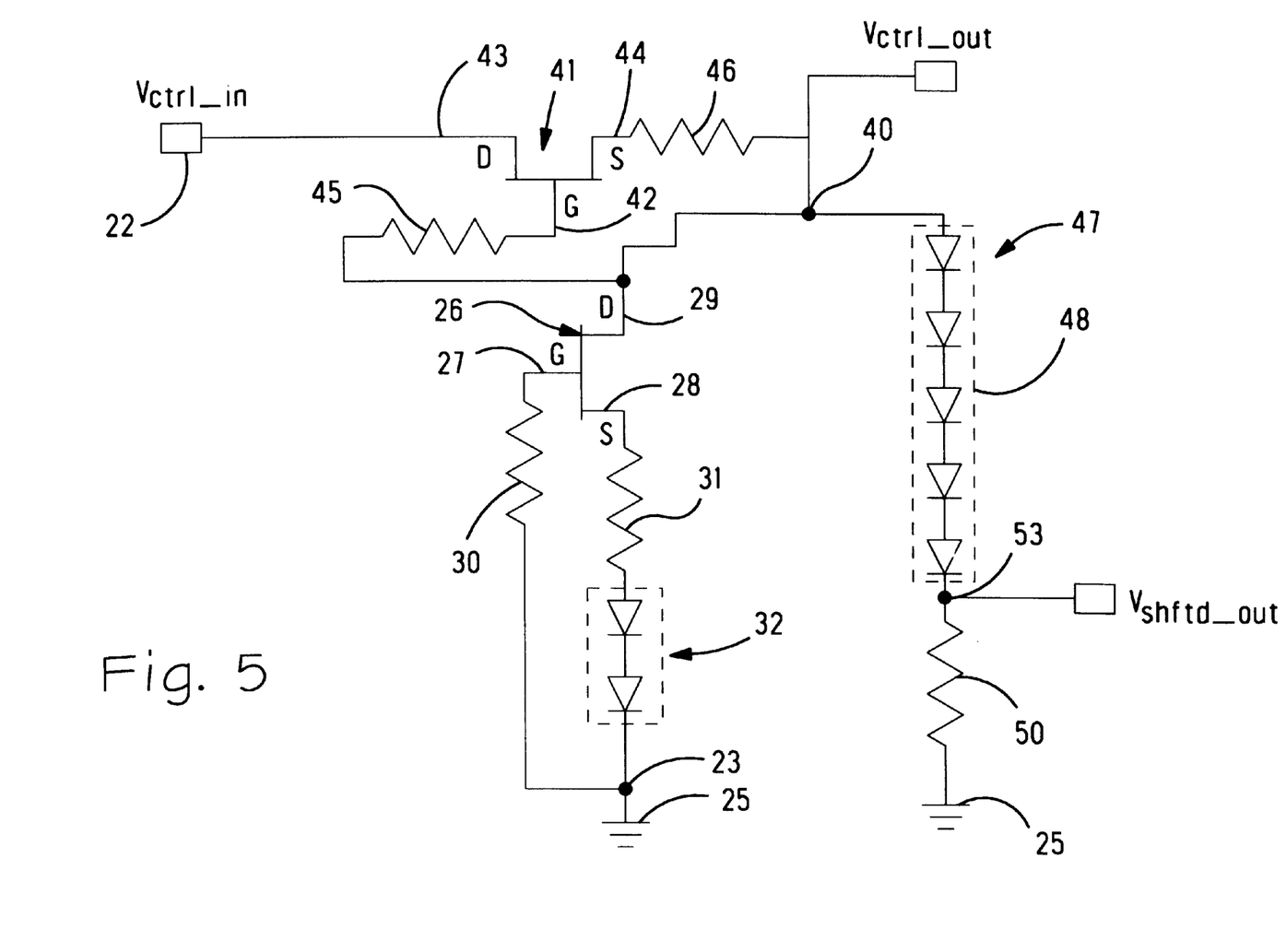
FIG. 5 is a schematic of an alternative embodiment of a current source according to the teachings of the present invention.
Figure 6:
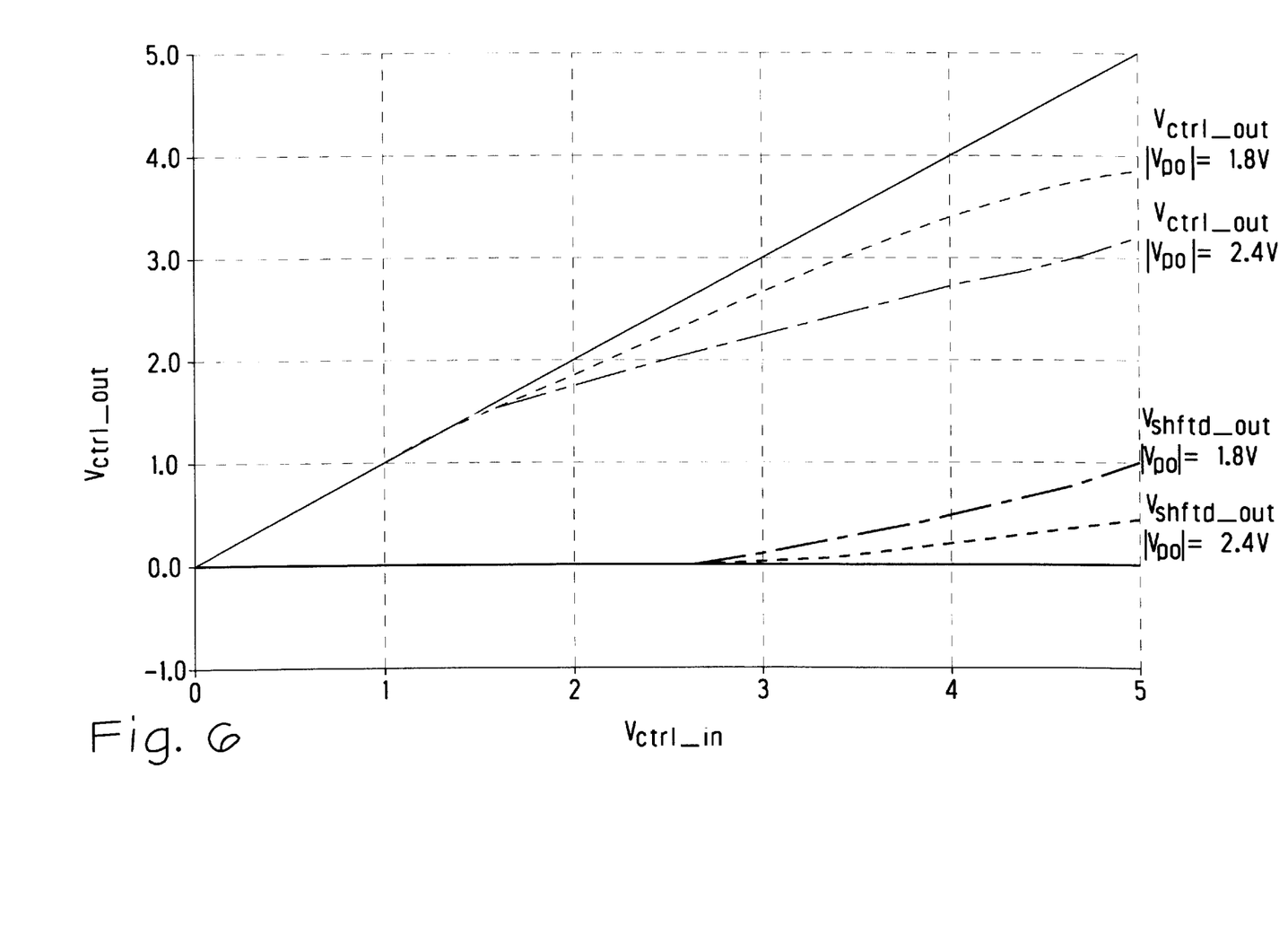
FIG. 6 is a graphical view of a transfer function of the circuit of FIG. 5.

With specific reference to FIG. 5 of the drawings, there is shown a schematic view of an alternate use of the current source according to the teachings of the present invention. This use is appropriate when a compensated control voltage output has a maximum value that is greater in magnitude for devices having lower magnitudes of pinch off voltage. There is shown a current source as shown in FIG. 2 of the drawings having the control FET (26) with the gate (27), source (28), and drain (29). The gate (27) is connected to ground (25) through source resistor (30). The source (28) is connected to ground (25) through the constant voltage drop element(32) in series with the source resistor (31). There is further shown a biasing FET (41) having a gate (42), a drain (43) and a source (44). The gate (42) and the source (44) are connected to a control FET drain bias point (40) through respective gate and source resistors (45, 46). The control FET drain bias point (40) biases the drain (29) of the control FET (26). The current source further comprises splitter arm (47). The splitter arm (47) further comprises a level shifter (48) shown as five series diodes, but may take alternate forms that provide a constant voltage drop of a desired value. The level shifter (48) is in series with a splitter resistor (50). The transfer functions of the voltage output at the $V_{CTRL\_OUT}$ or drain bias point (40) versus the control voltage input (22) or $V_{CTRL\_IN}$ is shown in FIG. 6 of the drawings. As the transfer functions illustrate, as the control voltage input increases so does the drain current through the control FET (26). The increasing drain current causes the voltage drop from the gate (27) to the source (28) of the control FET (26) to approach the pinch off voltage value. As the control FET pinches off, it increases in impedance and more current is directed through the splitter arm (47). The higher current flow causes a greater voltage drop across the splitter resistor (50). Consequently, the lower magnitude pinch off voltage control FET (26) device generates a larger voltage drop across the splitter arm (47) at the $V_{CTRL\_OUT}$ or control FET drain bias point (40). Accordingly, the reverse is also true. The greater magnitude pinch off voltage control FET (26) first device generates a smaller voltage drop across the splitter arm (47). The $V_{CTRL\_OUT}$ voltage value can be shifted into a specific range through use of the level shifter (48). The level shifter (48) provides a constant voltage drop over a range of current flow and is preferably approximately a 3v shift over five series diodes. Other constant voltage drop values and devices or circuits are also appropriate.

Figure 7:
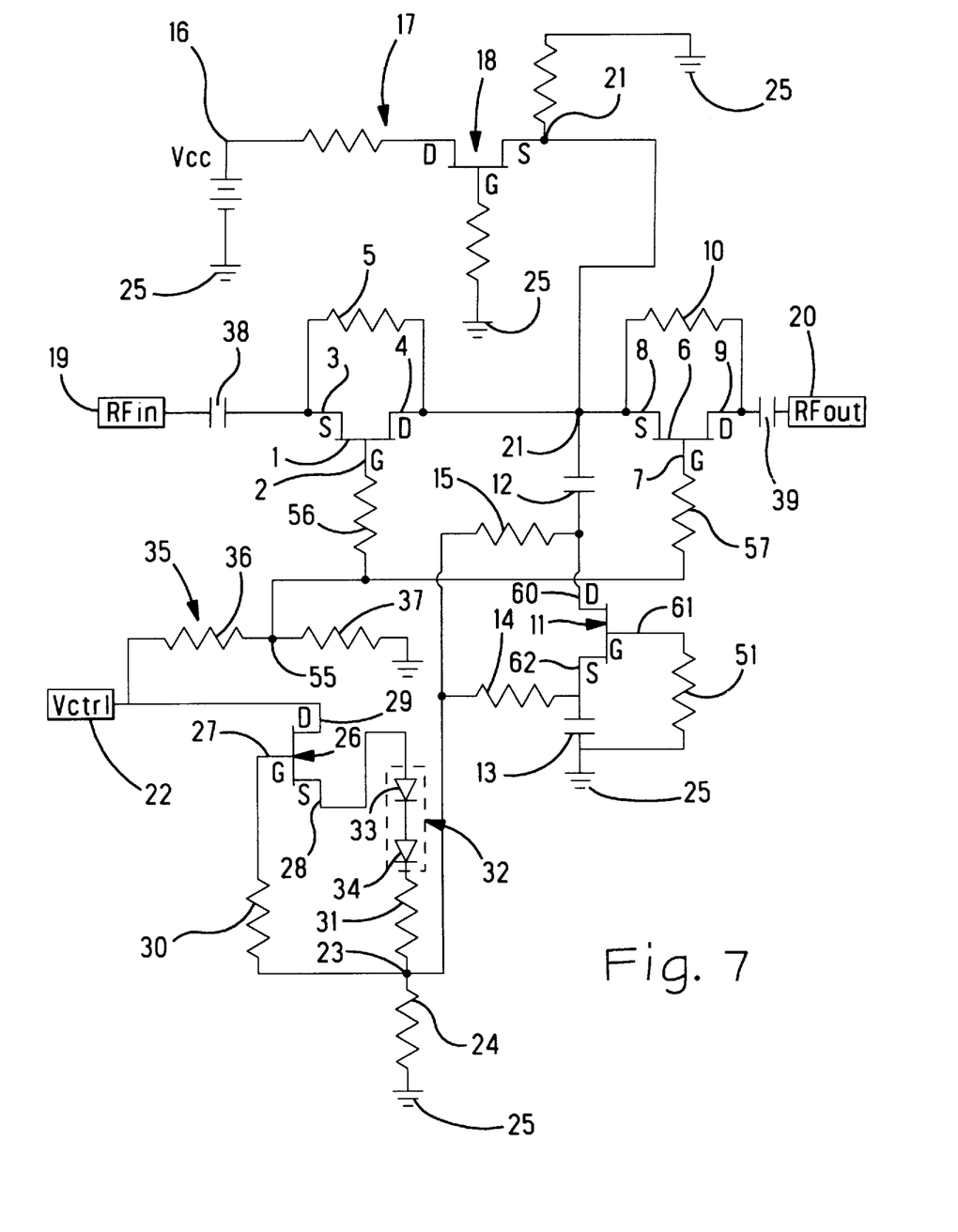
FIG. 7 is a schematic of a voltage variable attenuator according to the teachings of the present invention.

With specific reference to FIG. 7 of the drawings, there is shown a linear voltage variable attenuator having a compensation network according to the teachings of the present invention. The voltage variable attenuator comprises a first series FET (1) having a gate (2), source (3) and drain (4). A first series FET parallel resistor (5) is interconnected between the source (3) and the drain (4) of the first series FET (1) and in a preferred embodiment is approximately 250 ohms. The attenuator further comprises a second series FET (6) having a gate (7), source (8), and drain (9). A second series FET parallel resistor, also preferably 250 ohms, is interconnected between the source (8) and drain (9) of the second series FET (6). The first and second series FETs (1,6) are interconnected in series with each other at a common point (21). The attenuator further comprises a shunt FET (11) having a gate (61), source (62), and drain (60). The gate (61) of the shunt FET (11) is connected to reference potential (25) through a shunt FET gate resistor (51). The source (62) of the shunt FET (11) is AC coupled to reference potential through capacitor (13). The attenuator is biased by a pinch off voltage tracking circuit (17). The pinch off voltage tracking circuit (17) comprises a regulator FET (18) having its gate connected to reference potential (25) through a 5 kohm resistor and its source connected to reference potential (25) through a 125 kohm resistor. A fixed bias voltage of 5v is input into bias port (16) ("Vcc") and is connected to the regulator FET (18) through a 7 kohm resistor. A source of the regulator FET (18) is connected to the common point (21). The result of the regulator circuit (17) is to hold the common point (21) at the pinch off voltage value of regulator FET (18). The attenuator further comprises first shunt isolation capacitor (12) connected between the common point (21) and the shunt FET drain (60). Radio frequency ("RF") is input into the attenuator at RFin port (19). The attenuated RF energy appears at RFout port (20). DC voltage that appears at the RFin port (19) or the RFout port (20) is blocked by first blocking capacitor (38) and second blocking capacitor (39) respectively.

An attenuator according to the teachings of the present invention further comprises a voltage control circuit similar to the one illustrated in FIG. 3 of the drawings. The attenuator as shown in FIG. 7 of the drawings therefore, includes control FET (26) having a gate (27), source (28), and drain (29). The gate (27) and the source (28) of the control FET (26) are connected to the control FET gate resistor (30) preferably 5 kohms and the control FET source resistor (31) preferably 10 kohms, respectively. The constant voltage drop element (32) is in series with the control FET source resistor (31). A desired attenuation level is achieved by an appropriate voltage level at the control voltage input (22). The control voltage used by the attenuator circuit appears at the attenuation control voltage output (23). The attenuation control (23) is connected to the drain and the source of the shunt FET (11). The interconnection is made through first shunt isolation resistor (14) and second shunt isolation resistor (15) both preferably 5 kohms. The series FETs are also controlled by the control voltage input (22). A voltage control divider circuit (35) is connected between control voltage input (22) and the series FETs (1,6). The voltage control divider circuit (35) further comprises first divider resistor (36) preferably 57 kohms in series with second divider resistor (37) preferably 135 kohms. A voltage control divider tap point (55) interconnects the first divider resistor (36) with a second divider resistor (37). The voltage divider tap point (55) is connected to a first series FET control resistor (56) which is interposed between the gate (2) of the first series FET and the voltage divider tap point (55). Similarly, the voltage divider tap point (55) is connected to a second series FET control resistor (57). The second series FET control resistor (57) interconnects the voltage divider tap point (55) and the gate (7) of the second series FET (6). Both the first and second series FET control resistors are preferably 5 kohms. As the series FETs (1,6) have a pinch off voltage regulator as well as 250Ω parallel resistors (5,10), it is less important to control the series FETs with another pinch off tracking circuit.

It has been found that a voltage variable attenuator as shown in FIG. 1 is sensitive to variations in pinch off voltage. It has further been found that as the voltage control levels approach the pinch off voltage value, the circuit becomes more sensitive to changes in control voltage. Accordingly, it is proposed to use a voltage control circuit that compensates for sensitivities to pinch off voltage values. Specifically, it is proposed to provide a voltage regulating function for the shunt FET (11) of the attenuator. Advantageously, FETs made by the same process that are in close physical proximity to each other, exhibit similar pinch off voltage characteristics. Utilizing this known aspect, a compensation network is made using a control FET (26) that exhibits similar pinch off voltages as the FETs used in the circuit that is being compensated, for example, FETs (1,6, 11). It is desirable to have changes in current or voltage characteristics relative to the changes in pinch off voltage value. The current source as shown in FIG. 2 can be mathematically described as follows:

Where:

$V_{gs}$=gate (27) to source (28) voltage of control FET (26).

$I_{ds}$=drain current through control FET (26).

$R_s$=ohmic value of control FET source resistor (31).

$V_{drop}$=magnitude of the voltage drop over constant voltage drop element (32).

$g_m$=transconductance of FET (26).

$V_{po}$=pinch off voltage of FET (26).

And:

$$V_{gs} = -I_{ds} * R_s - V_{drop}$$

$$I_{ds} = g_m * (V_{gs} - V_{po})$$

Solving for $I_{ds}$:

$$I_{ds}=g_m*(-I_{ds}*R_s-V_{drop}-V_{po})$$

$$I_{ds}*(1+g_m*R_s)=g_m*(-V_{drop}-V_{po})$$

$$I_{ds}=g_m*(-V_{drop}-V_{po})/(1+g_m*R_s)$$

For $g_m*R_s \gg 1$:

$$I_{ds}=g_m*(-V_{drop}-V_{po})/(g_m*R_s)$$

$$I_{ds}=(-V_{drop}-V_{po})/R_s$$

Figure 8:
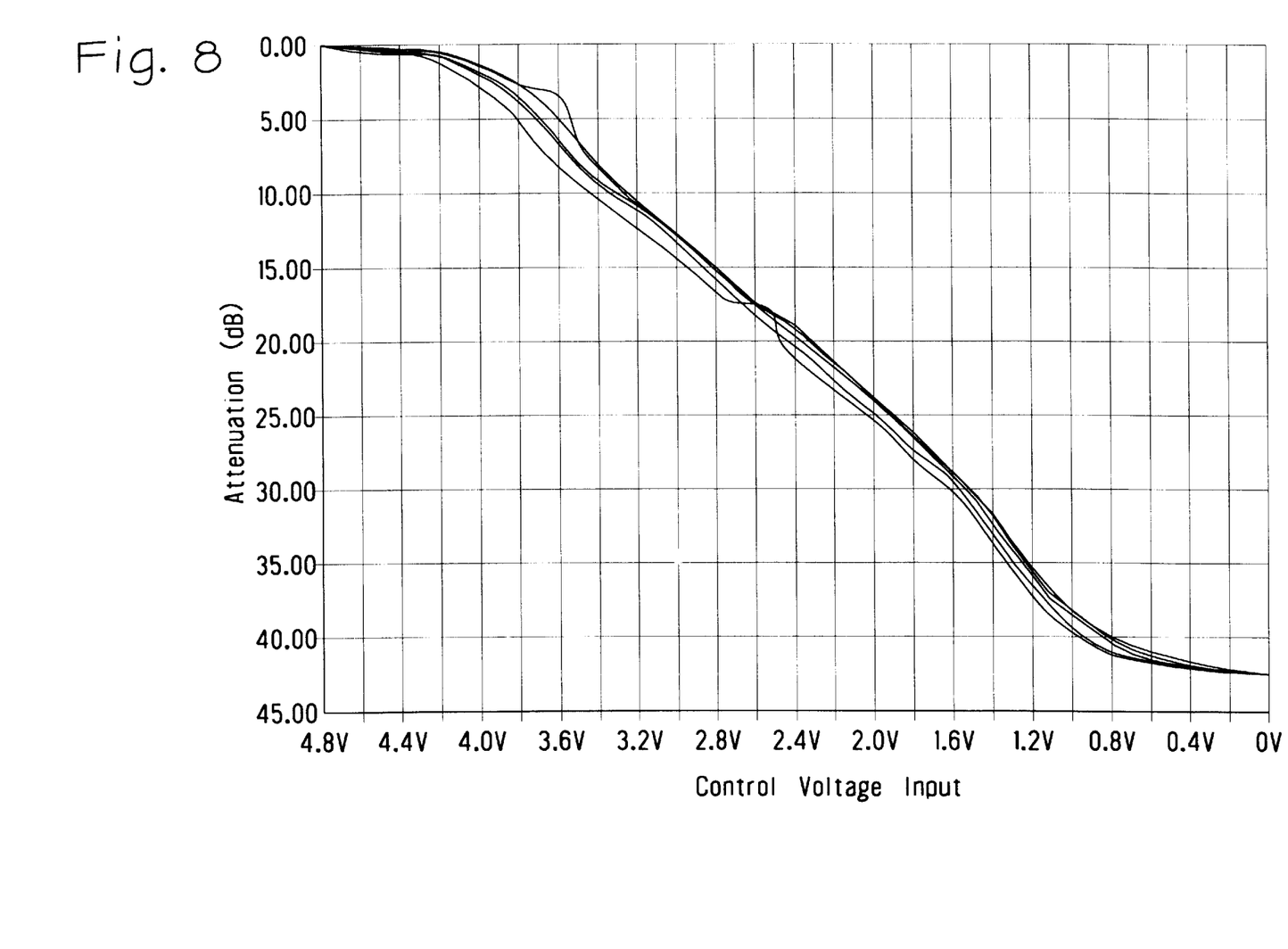
FIG. 8 is a graphical view of the transfer function of a voltage variable attenuator of FIG. 7 covering the range across typical pinch off voltage variations.
Figure 9:
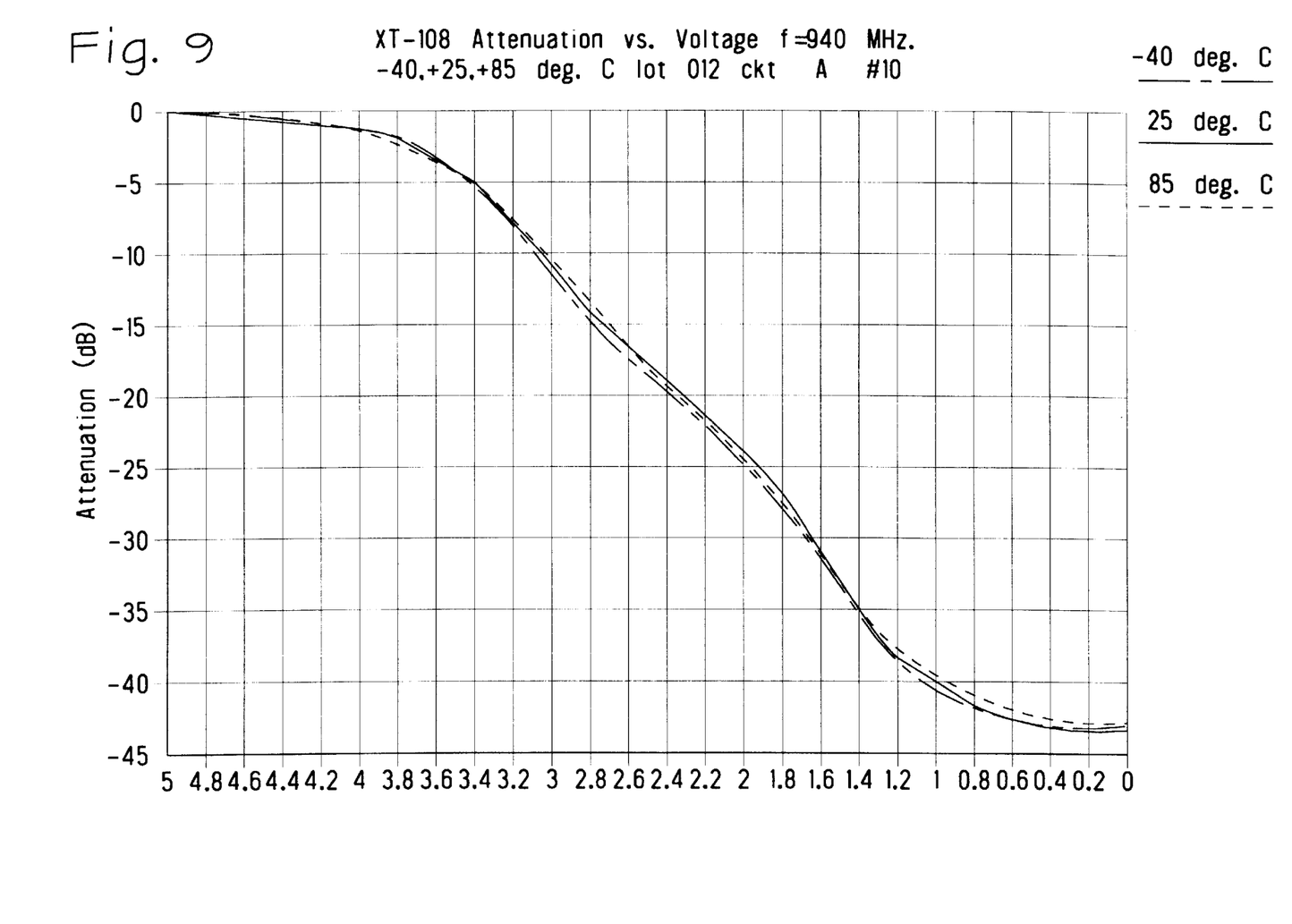
FIG. 9 is a graphical view of the transfer function of a voltage variable attenuator of FIG. 7 over a range of operating temperatures.

As can be appreciated by one of ordinary skill in the art, a smaller control FET source resistor (31) can be used to realize a particular current flow based on a given control voltage input than as can be realized in a pure resistive divider network. Use of a smaller valued resistor being advantageous in that it requires less physical space in a circuit layout than a larger valued resistor. It is also an advantage that a circuit according to FIGS. 2 and 3 of the drawings produces a larger change in current flow or control voltage output value for a given change in pinch off voltage than a pure resistive divider network. In a circuit according to FIG. 3 of the drawings, a maximum control voltage output (23) increases as the pinch off voltage value increases. As the control voltage input is linearly increased, the control voltage output (23) also increases linearly until the voltage across the drain (29) to source (28) of the control FET (26) nears the pinch off voltage value. As the control voltage input (22) approaches the pinch off voltage value, the transfer function of the circuit results in a smaller change in voltage control output (23) for a given linear change in voltage control input (22). As the voltage control output (23) gets closer to the pinch off voltage value, there is an increasingly smaller change in the control voltage output differential for a given linear change in the control voltage input (22). The transfer function of the control voltage output (23) therefore, approaches the pinch off voltage value generally asymptotically as the control voltage input (22) ramps linearly. For FETs having a different pinch off voltage value, the point at which the transfer function changes from a linear response to a more gradually increasing response occurs at a different voltage value that is dependent upon the pinch off voltage of the control FET (26). Other FETs used in the circuit are typically in close physical proximity on a processed substrate and, therefore, have similar pinch off voltage values. Accordingly, a circuit that is sensitive to pinch off voltage changes, can benefit from a control voltage that is nonlinear and a function of the pinch off voltage value. In a voltage variable attenuator, and with specific reference to FIG. 4, the transfer function of the voltage source of FIG. 3 is linear for voltage values well below the pinch off voltage. As the attenuation control voltage (23) approaches the pinch off value of control FET (26) and similarly shunt FET (11), shunt FET (11) and consequently the attenuator circuit becomes more sensitive to changes in the attenuation control voltage (23). Specifically, for a given voltage differential between the gate and source of the shunt FET (11) that is within 5–15% of the pinch off voltage value, the differential resistance is greater. Accordingly, it is beneficial that the attenuation control voltage (23) exhibits smaller changes in voltage for a given change in control voltage input (22) when the attenuation control voltage (23) is within 90% or greater than the magnitude of the pinch off voltage value. A circuit according to the teachings of the present invention provides for smoother and more controlled changes in the impedance of shunt FET (11) permitting the attenuator circuit to achieve a more linear overall response. FIG. 8 of the drawings is a graph of attenuation versus control voltage input for a number of devices having varied pinch off voltage values. The graph in FIG. 8 illustrates the recognized predictability of an attenuator circuit as shown in FIG. 7 of the drawings over a typical range of pinch off voltage values. It is also known that pinch off voltage values drift with temperature. FIG. 9 of the drawings a graph of attenuation versus control voltage input of a single attenuator according to FIG. 7 of the drawings over a 125° C. temperature range. FIG. 9 of the drawings illustrates the recognized repeatability of the attenuator according to the teachings of the present invention.

Figure 10:
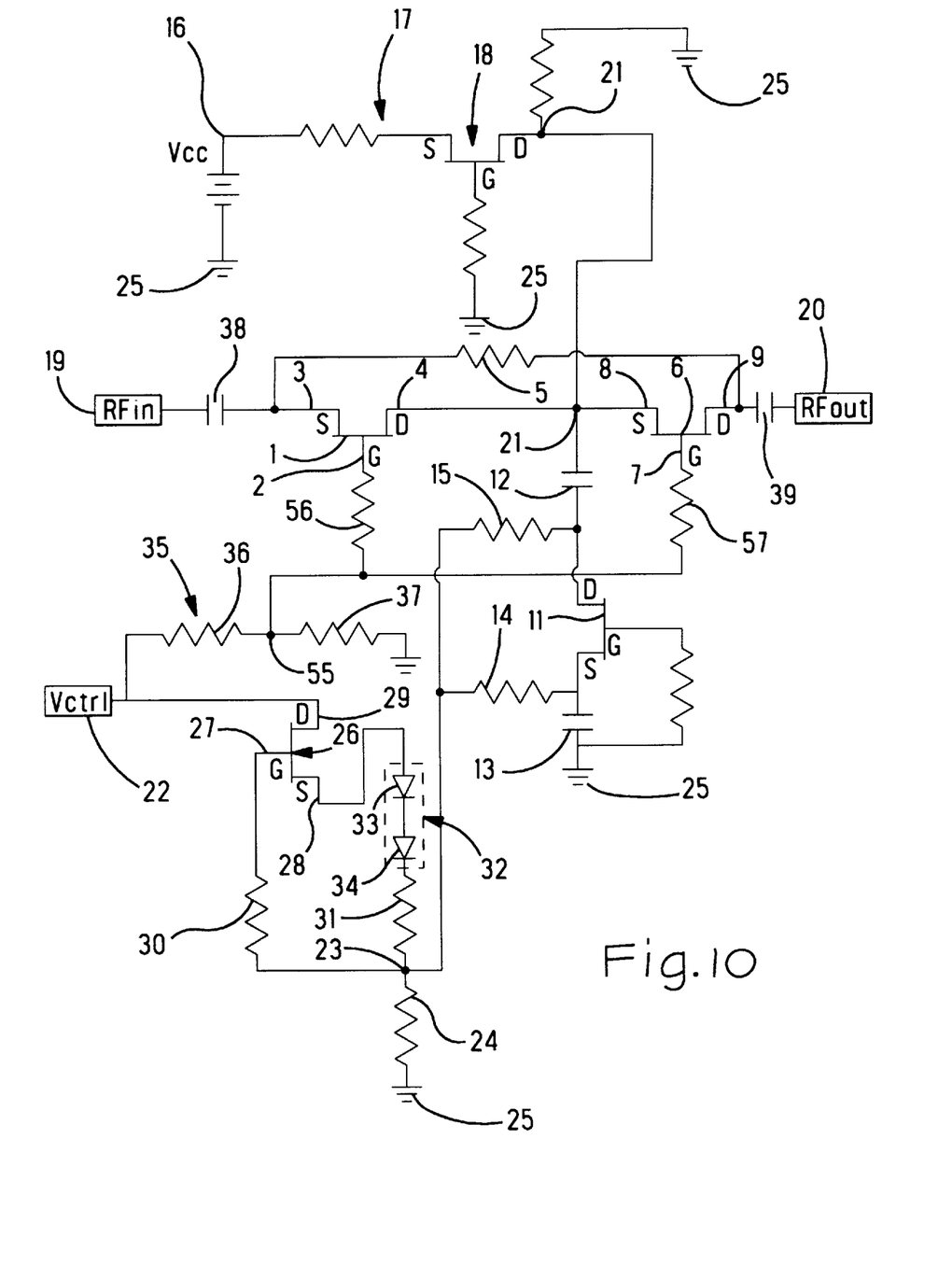
FIG. 10 is a schematic of an alternate embodiment of a voltage variable attenuator according to the teachings of the present invention.
Figure 11:
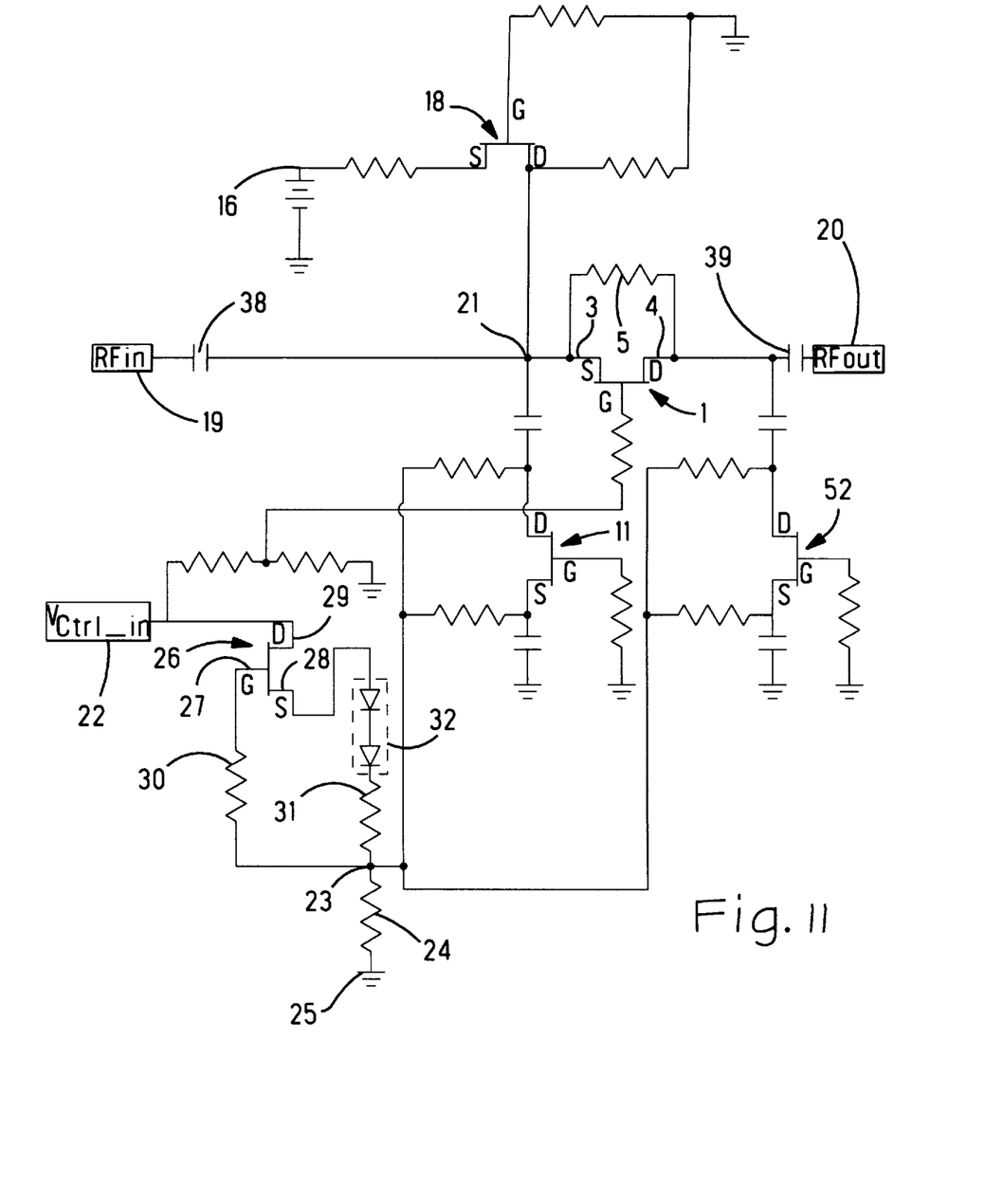
FIG. 11 is a schematic of yet another alternate embodiment of a voltage variable attenuator according to the teachings of the present invention.

FIGS. 10 and 11 of the drawings are schematic representations of alternate attenuator circuits that will benefit from a control circuit according to the teachings of the present invention. FIG. 10 is a schematic view of a T-type attenuator circuit similar to the one shown in FIG. 7 of the drawings except that there is a single parallel resistor (5) bridging both series FETs (1,7) as opposed to respective parallel resistors (5,10) for each series FET (1,7). FIG. 11 is a schematic view of a PI-type attenuator circuit. In the PI-type attenuator, there is a single series FET (1) and two shunt FETs (11,52) each shunting the source (3) and drain (4) respectively of the series FET (1). The operation is related to the attenuator shown in FIG. 7 of the drawings in that the opposite response of the series and shunt FETs to a ramp at the attenuation control (23) defines the attenuation versus control voltage input transfer function. Accordingly, it also benefits from a voltage source according to the present invention for the attenuation control as described hereinabove.

Other advantages of the invention are apparent from the detailed description by way of example, and from accompanying drawings, and from the spirit and scope of the appended claims.

We claim:

1. A current source comprising a control FET having a gate, drain, and source, the gate held at a tracking potential, a resistor and a constant voltage drop element connected in series with said source, and a control voltage input applied to the control FET drain that varies over a range between 0 volts and a maximum voltage, wherein a change in the current flow through said control FET from a linear relationship to a nonlinear relationship is a function of a pinchoff voltage value of the control FET.

2. A current source as recited in claim 1 wherein said constant voltage drop element comprises at least one diode.

3. A current source as recited in claim 1, wherein said constant voltage drop element comprises at least two diodes in series.

4. A current source as recited in claim 1, wherein said constant voltage drop element comprises a voltage source.

5. A current source as recited in claim 1, wherein said constant voltage drop element comprises a Zener diode.

6. A current source as recited in claim 1, further comprising a gate resistive element interconnected between said gate and tracking potential.

7. A voltage source comprising:

a control FET having a gate, drain, and source, the gate held at a tracking potential, a resistor and a constant voltage drop element connected in series with said source, and a control voltage input applied to the control FET drain, the control voltage input varying over a range between 0 volts and a maximum voltage, and further comprising an impedance element in series with said resistor, wherein a current flow through said control FET generates a control output voltage across said impedance element wherein a change in the relationship between the control voltage input and the control voltage output from a linear relationship to a nonlinear relationship is a function of a pinchoff voltage value of the control FET.

8. A voltage source as recited in claim 7 wherein said constant voltage drop element comprises at least one diode.

9. A voltage source as recited in claim 7 wherein said constant voltage drop element comprises at least two diodes in series.

10. A voltage source as recited in claim 7 wherein said constant voltage drop element comprises a voltage source.

11. A voltage source as recited in claim 7 wherein said constant voltage drop element comprises a Zener diode.

12. A voltage source as recited in claim 7, further comprising a gate resistive element interconnected between said gate and tracking potential.

13. A voltage variable attenuator comprising:
 a first and second series FET having a common point interposed therebetween;
 a shunt FET interposed between said common point and reference potential, said shunt FET having a shunt FET drain and a shunt FET source, said shunt FET source coupled to said Shunt FET drain;
 a control voltage to control attenuation level; and
 an attenuation control receiving said control voltage, said attenuation control comprising a control FET having a gate, drain and source, said gate of said control FET held at a tracking potential, a source resistive element and a constant voltage drop element connected in series with said source, said control voltage applied to said drain of said control FET, and said tracking potential applied to said shunt FET drain.

14. A variable voltage attenuator as recited in claim 13, wherein said constant voltage drop element comprises at least one diode.

15. A variable voltage attenuator as recited in claim 13, wherein said constant voltage drop element comprises at least two diodes in series.

16. A variable voltage attenuator as recited in claim 13, wherein said constant voltage drop element comprises a voltage source.

17. A variable voltage attenuator as recited in claim 13, wherein said constant voltage drop element comprises a Zener diode.

18. A variable voltage attenuator as recited in claim 13, and further comprising a gate resistive element interconnected between said gate and tracking potential.

19. A voltage variable attenuator having a control voltage input comprising:
 a first series FET having a source, gate and drain and a first shunt FET having a source, gate and drain, said first shunt FET drain coupled to the first series FET source and a second shunt FET having a source, gate and drain, said second shunt FET drain coupled to the first series FET drain, said gate of said first and second shunt FETs interconnected to reference potential, and
 an attenuation control receiving the control voltage input and generating a control voltage output, the attenuation control comprising a control FET having a gate, drain and source, said gate of said control FET held at a tracking potential, a source resistive element and a constant voltage drop element connected in series with said source of said control FET, the control voltage input applied to said drain of said control FET and to said gate of said first series FET, and said control voltage output is coupled to respective drains and sources of said first and second shunt FETs.

20. A variable voltage attenuator as recited in claim 19, wherein said constant voltage drop element comprises at least one diode.

21. A variable voltage attenuator as recited in claim 19, wherein said constant voltage drop element comprises at least two diodes in series.

22. A variable voltage attenuator as recited in claim 19, wherein said constant voltage drop element comprises a voltage source.

23. A variable voltage attenuator as recited in claim 19, wherein said constant voltage drop element comprises a Zener diode.

24. A variable voltage attenuator as recited in claim 19, and further comprising a gate resistive element interconnected between said gate and tracking potential.

25. A voltage source as recited in claim 7, further comprising a resistive element connected between said control voltage input and said control FET drain and a splitter arm connected between said control FET drain and a reference potential.

26. A voltage source as recited in claim 25 wherein said splitter arm comprises a level shifter in series with a splitter resistive element.

27. A voltage source as recited in claim 26 wherein said level shifter comprises at least one diode.

28. A voltage variable attenuator as recited in claim 13 wherein said tracking potential is applied to said shunt FET drain and source through respective shunt FET drain and source impedance elements.

29. A voltage variable attenuator as recited in claim 19 wherein said control voltage output is connected to respective sources of said first and second shunt FETs through respective source impedance elements.

* * * * *